United States Patent
Liu et al.

(10) Patent No.: US 12,237,410 B1
(45) Date of Patent: Feb. 25, 2025

(54) TRENCH GATE SILICON CARBIDE MOSFET DEVICE AND FABRICATION METHOD THEREOF

(71) Applicant: JSAB TECHNOLOGIES (SHENZHEN) LTD., Shenzhen (CN)

(72) Inventors: Yong Liu, Shenzhen (CN); Hao Feng, Shenzhen (CN); Xin Peng, Shenzhen (CN); Johnny Kin On Sin, Shenzhen (CN)

(73) Assignee: JSAB TECHNOLOGIES (SHENZHEN) LTD., Shenzhen (CN)

( * ) Notice: Subject to any disclaimer, the term of this patent is extended or adjusted under 35 U.S.C. 154(b) by 0 days.

(21) Appl. No.: 18/937,369

(22) Filed: Nov. 5, 2024

(30) Foreign Application Priority Data

Nov. 10, 2023 (CN) .......................... 202311489576.4

(51) Int. Cl.
*H01L 29/78* (2006.01)
*H01L 21/04* (2006.01)
*H01L 29/06* (2006.01)
*H01L 29/16* (2006.01)
*H01L 29/66* (2006.01)

(52) U.S. Cl.
CPC ........ *H01L 29/7806* (2013.01); *H01L 21/047* (2013.01); *H01L 29/0696* (2013.01); *H01L 29/1608* (2013.01); *H01L 29/66068* (2013.01); *H01L 29/7813* (2013.01)

(58) Field of Classification Search
None
See application file for complete search history.

(56) References Cited

U.S. PATENT DOCUMENTS

2014/0252465 A1   9/2014  Takaya et al.
2018/0358463 A1*  12/2018 Kobayashi ........ H01L 29/41766
(Continued)

FOREIGN PATENT DOCUMENTS

CN    109244137 A    1/2019
CN    109256427 A    1/2019
(Continued)

OTHER PUBLICATIONS

First Office Action and Search Report mailed Dec. 22, 2023 in corresponding CN Application 202311489576.4, with English translation, 14 pages.

*Primary Examiner* — William C Trapanese
(74) *Attorney, Agent, or Firm* — Muncy, Geissler, Olds & Lowe, P.C.

(57) ABSTRACT

A trench gate silicon carbide metal oxide semiconductor field effect transistor (MOSFET) device and a fabrication method thereof. A second conductive heavily doped layer at the bottom corner of a trench gate is electrically connected to a second conductive heavily doped layer on another side edge of the trench gate through a layout design, which ensures a ground potential during voltage blocking state. This design protects the insulating layer in the trench gate and the Schottky contact in a junction barrier Schottky (JBS) diode, thereby enhancing device reliability. Moreover, in a diode operating mode, P+ on the left and right sides of the trench gate are connected to a positive potential. When the P+/N− junction is activated, the conductivity modulation can be implemented through hole injection, thereby improving the device's ability to withstand surge current impacts.

10 Claims, 16 Drawing Sheets

(56) References Cited

U.S. PATENT DOCUMENTS

2019/0181229 A1 6/2019 Okumura
2020/0058740 A1* 2/2020 Okumura ............ H01L 29/0865

FOREIGN PATENT DOCUMENTS

| | | |
|---|---|---|
| CN | 114649421 A | 6/2022 |
| CN | 114927561 A | 8/2022 |
| CN | 116110796 A | 5/2023 |
| CN | 116314302 A | 6/2023 |
| CN | 116387362 A | 7/2023 |
| CN | 116487435 A | 7/2023 |
| CN | 116598354 A | 8/2023 |
| CN | 116598358 A | 8/2023 |
| CN | 116721925 A | 9/2023 |
| JP | 2010109221 A | 5/2010 |
| KR | 20220039253 A | 3/2022 |

* cited by examiner

TRENCH GATE SILICON CARBIDE MOSFET DEVICE AND FABRICATION METHOD THEREOF

FIELD OF TECHNOLOGY

The present disclosure relates to a power semiconductor device, specifically a trench gate silicon carbide metal oxide semiconductor field effect transistor (MOSFET) device and a fabrication method thereof.

BACKGROUND

Silicon carbide is a third-generation power semiconductor material with several advantages over conventional silicon materials, including a high critical electric field, high carrier saturation velocity, and good heat dissipation. These properties make it more suitable for the fabrication of high-performance power MOSFET devices. A trench gate silicon carbide MOSFET can eliminate the junction field effect transistor (JFET) effect present in a planar gate structure, enabling a higher channel density. This design reduces the specific on-resistance of the device and allows a higher current to pass through the same chip area.

However, during reverse voltage withstanding of a trench silicon carbide MOSFET, there is a high electric field intensity (>4 MV/cm) at the bottom corner of a trench due to the curvature effect, which may lead to the problems of low breakdown voltage and reliability of a chip. Therefore, it is important for the trench gate silicon carbide MOSFET to reduce the electric field at the bottom corner of a trench gate to protect a gate dielectric layer from performance degradation under the high electric field. The trench gate silicon carbide MOSFET has a body diode (a PiN diode), but the body diode has a high forward voltage drop VF due to a large band gap (3.26 eV) of a silicon carbide material. In addition, the body diode is a bipolar conductive device, such that a small number of carriers stored in a drift region need to be extracted during reverse recovery, resulting in a high reverse recovery charge. Moreover, a small number of carriers will stimulate the conversion of basal plane dislocation (BPD) in the silicon carbide material into stacking faults (SF) during recombination, resulting in bipolar degradation. Therefore, it is a development trend to integrate a Schottky diode with low forward voltage drop VF and unipolar conduction in the trench silicon carbide MOSFET.

A Schottky diode integration solution in the prior art is to integrate the Schottky diode into a source trench by adding the source trench 108, as shown in FIG. 1. However, such a solution has the following drawbacks: 1. Since the source trench does not generate an MOS channel during normal conduction of the MOSFET, the specific on-resistance of the device increases, thereby sacrificing the turn-on performance of the device. 2. The addition of the source trench will cause a potential risk of wafer warpage, and in serious cases, a wafer cannot even be adsorbed by vacuum during photolithography, thus affecting the normal production and processing of the device. The wafer warpage can also result in misalignment during the etching of a contact hole, resulting in low yield and limitation on the mass production of devices.

SUMMARY

In view of the problems existing in a trench gate silicon carbide MOSFET device in the prior art mentioned above, there is a demand for a new trench gate silicon carbide MOSFET device and its fabrication method. This device should aim to decrease the Miller capacitance and switching losses without compromising the turn-on performance and production yield of the device. It should facilitate the integration of a junction barrier Schottky (JBS) diode, reducing the turn-on voltage drop and reverse recovery charge of the diode. A second conductive heavily doped layer at the bottom corner of a trench gate is electrically connected to a second conductive heavily doped layer on another side edge of the trench gate through a layout design, so as to ensure a ground potential during voltage blocking state, protect an insulating layer in the trench gate and a Schottky contact in the JBS diode, and improve the reliability of the device. Moreover, in a diode operating mode, the P+ region on left and right sides of the trench gate are connected to a positive potential. When the P+/N− junction is activated, the conductivity modulation can be implemented through hole injection, thereby improving the device's ability to withstand surge current.

To achieve the above objective, the present disclosure proposes a novel trench gate silicon carbide MOSFET device and a fabrication method thereof.

A trench gate silicon carbide MOSFET device is provided, including a drain electrode located at the bottom of the device and a source electrode located at the top of the device, where a first conductive heavily doped silicon carbide substrate (including a buffer layer) is disposed on the drain electrode. a first conductive lightly doped silicon carbide epitaxial layer is disposed on the first conductive heavily doped silicon carbide substrate. trench gates arranged periodically are provided on a surface of the first conductive lightly doped silicon carbide epitaxial layer. each of the trench gates includes a gate dielectric layer, an insulating layer, a low-temperature oxide layer, and a conductive dielectric layer. a second conductive well region is disposed between the trench gates. an interlayer dielectric layer is disposed above the trench gate.

One side surface of the trench gate features a second conductive heavily doped side edge layer extending from a bottom corner of the side edge to an upper surface of the first conductive lightly doped silicon carbide epitaxial layer. On the bottom corner of the opposite side surface of the trench gate, a second conductive heavily doped bottom corner layer is present, which is connected to the second conductive heavily doped side edge layer to obtain a same potential as the source electrode. Additionally, a Schottky contact connected to the first conductive lightly doped silicon carbide epitaxial layer and ohmic contacts connected to the second conductive heavily doped bottom corner layer and the second conductive heavily doped side edge layer are formed at the bottom of the trench gate. A first conductive heavily doped source region is provided inside the second conductive well region and in a position adjacent to an upper surface of the second conductive heavily doped side edge layer. The interlayer dielectric layer covers part of the first conductive heavily doped source region and the source electrode short-circuits the second conductive heavily doped side edge layer and the first conductive heavily doped source region.

Further, each of the trench gates is a stripe-shaped cell trench, with one side surface of the stripe-shaped cell trench featuring a second conductive heavily doped side edge layer extending from a bottom corner of the side edge to the upper surface of the first conductive lightly doped silicon carbide epitaxial layer. On the opposite side surface of the stripe-shaped cell trench, a second conductive heavily doped bottom corner layer is positioned. Both the bottom corner layer and the side edge layer wrap the bottom corners of the trench gate. The distinction lies in the fact that the side edge layer further wraps a side wall and transversely expands on the surface of the epitaxial layer to form an inverted "L" shape. The positions of the bottom corner layer and the side edge layer on two sides of a trench can be interchanged.

Further, the device adopts a square cell layout design. The trench gates are crosswise arranged in a transverse direction and a longitudinal direction. The second conductive well region is segmented into evenly spaced island shapes by the crosswise arranged trench gates. Adjacent to the second conductive well region, one of the four surfaces of a corresponding trench gate is provided with a second conductive heavily doped side edge layer. A bottom corner of opposite surface of the trench gate adjacent to the second conductive well region is provided with two second conductive heavily doped bottom corner layers which extend on a bottom edge connecting the two bottom corners and are connected to each other. Therefore, in the layout design, each of four bottom corners is provided with a second conductive heavily doped layer (P+). A JBS diode is integrated at the bottom of the trench gate in a transverse direction. At the bottom of the trench gate in another position, a metal is in contact with a second conductive heavily doped region to form an ohmic contact. The positive electrode of the JBS diode is connected to the source electrode through a dummy cell.

Further, a Schottky metal is titanium, nickel, and/or molybdenum.

Further, each of the trench gates has a depth of 0.5-5 microns.

Further, the conductive dielectric layer is a polycrystalline silicon layer or other metal silicide material. A Schottky contact is formed in a position where the metal is in contact with the first conductive lightly doped silicon carbide epitaxial layer, and an ohmic contact is formed in a position where the metal is in contact with the second conductive heavily doped region (P+). In a position where a bottom corner and a side edge of the second conductive heavily doped region are intersected, the metal is only in contact with the second conductive heavily doped region (P+) to form an ohmic contact. While in a position where the bottom corner and the side edge of the second conductive heavily doped region (P+) are not intersected, the metal is simultaneously in contact with the first conductive lightly doped silicon carbide epitaxial layer and the second conductive heavily doped region (P+) to form a Schottky contact and an ohmic contact, respectively.

Further, the low-temperature oxide layer is an insulating material with a deposition temperature of no higher than 600° C., such as a silicon dioxide layer.

Further, the gate dielectric layer can be made from silicon dioxide, silicon nitride, and/or hafnium dioxide, with a thickness of 0.02-0.5 microns.

The present disclosure further provides a method for fabricating a trench gate silicon carbide MOSFET device, including the following steps:

Firstly, growing a first conductive lightly doped silicon carbide epitaxial layer on a substrate (including a buffer layer).

Secondly, forming a second conductive well region and a first conductive heavily doped source region on an upper surface of the first conductive lightly doped silicon carbide epitaxial layer using ion implantation.

Thirdly, etching a trench in the upper surface of the first conductive lightly doped silicon carbide epitaxial layer using dry etching.

Fourthly, forming a second conductive heavily doped side edge region on a side surface of the trench using selective ion implantation.

Fifthly, forming a second conductive heavily doped region at another bottom corner of the trench using selective ion implantation, and after the ion implantation is completed, activating ions using high-temperature annealing, where before the annealing process, a carbon film is needed to cover a surface of silicon carbide, so as to prevent the outward diffusion of impurities and the migration of silicon carbide atoms on the surface.

Sixthly, growing a gate dielectric layer, depositing a silicon nitride insulating layer, performing photolithography and etching to form a source metal window, depositing a source ohmic contact metal, performing photolithography and etching on the metal, and performing annealing to form a source ohmic contact.

Seventhly, removing a silicon nitride layer and a silicon dioxide layer at the bottom of a trench gate using photolithography and etching, depositing a layer of Schottky metal, performing photolithography and etching, and reserving the Schottky metal at the bottom of the trench gate.

Eighthly, depositing a silicon dioxide layer at a low temperature and performing back etching.

Ninthly, performing wet etching on a silicon nitride layer, then depositing a conductive dielectric polycrystalline silicon layer, and performing photolithography and etching.

Tenthly, depositing an interlayer dielectric layer at a low temperature and performing photolithography and etching.

Finally, depositing a thick metal, performing photolithography and etching, and performing back metal deposition and annealing.

The working principle of the present disclosure is explained as follows:

The losses in a silicon carbide MOSFET comprise conduction loss and switching loss, with the conduction loss primarily stemming from the channel resistor, an epitaxial layer resistor, a substrate resistor, and a metal contact resistor. For the silicon carbide MOSFET, the carrier mobility is severely reduced by Coulomb scattering due to a large number of interface states in the gate dielectric layer, which leads to a high proportion of channel resistance in the total resistance of the MOSFET (BV≤1,700 V). One way to reduce the channel resistance is to increase the channel density, which is equivalent to parallel connection of more channel resistors, thus reducing the total channel resistance. According to the JBS diode integration solution proposed by the present disclosure, source trenches do not need to be added, such that the density of an MOS channel is not reduced and the conduction loss of the MOSFET is not sacrificed. The elimination of the source trenches can enhance wafer flatness, address issues like vacuum suction, and increase processing yield during device fabrication. According to the present disclosure, one side edge and all bottom corners of the trench gate are each protected by the second conductive heavily doped bottom corner layer (P+), and the second conductive heavily doped bottom corner layer is connected to the second conductive heavily doped side edge layer through the layout design to obtain the same potential as the source electrode. Due to the design of the second conductive heavily doped bottom corner layer and the second conductive heavily doped side edge layer and the fact that the low-temperature oxide layer is filled in a space below the conductive dielectric polycrystalline silicon layer within the trench, the Miller capacitance is reduced. This reduction minimizes switching losses, consequently lowering the overall device loss. During the blocking state, the second conductive heavily doped bottom corner layer and the second conductive heavily doped side edge layer with the ground potential can reduce electric fields of a gate oxide layer and a Schottky contact position to implement effective protection, such that the breakdown voltage and reliability of the MOSFET device are improved, and the problem of high electric leakage of the Schottky diode under a high electric field is solved.

The Schottky contact is designed on the bottom plane of the trench gate to avoid the problem of non-uniform current caused by side wall integration. Moreover, the thickness of a drift region (subtracting the depth of the trench gate from the thickness of the silicon carbide epitaxial layer) of the Schottky diode is reduced, such that the conduction loss VF of the diode is further reduced. The Schottky contact forms a JBS structure with the second conductive heavily doped regions on two sides of the trench gate. Compared with an ordinary Schottky diode integration solution, under a surge current in a special working condition, the current flowing through the Schottky diode causes a P+/N− junction to be activated, and holes are injected from the P+ region to achieve conductivity modulation, thereby enhancing the diode's ability to withstand surge current. The JBS structure can effectively bypass a P well/N-epi diode to avoid bipolar degradation of the device.

DETAILED DESCRIPTION OF THE EMBODIMENTS

It should be noted that the device structure herein is not limited to the MOSFET, and other unipolar or bipolar device structures are also applicable. Similarly, the semiconductor material herein is not limited to the silicon carbide material, and other silicon, germanium, and gallium nitride materials are also applicable. The corresponding positional words such as "up", "down", "left", and "right" described herein correspond to the relative positions in the reference diagrams, and the fixed direction is not limited to a specific implementation. The gate dielectric layer described herein is not limited to the silicon dioxide and may be other silicon nitride or hafnium dioxide layers, and the conductive dielectric layer is also not limited to the doped polycrystalline silicon and may be other metal silicide film materials.

Embodiment 1

Figure 1:
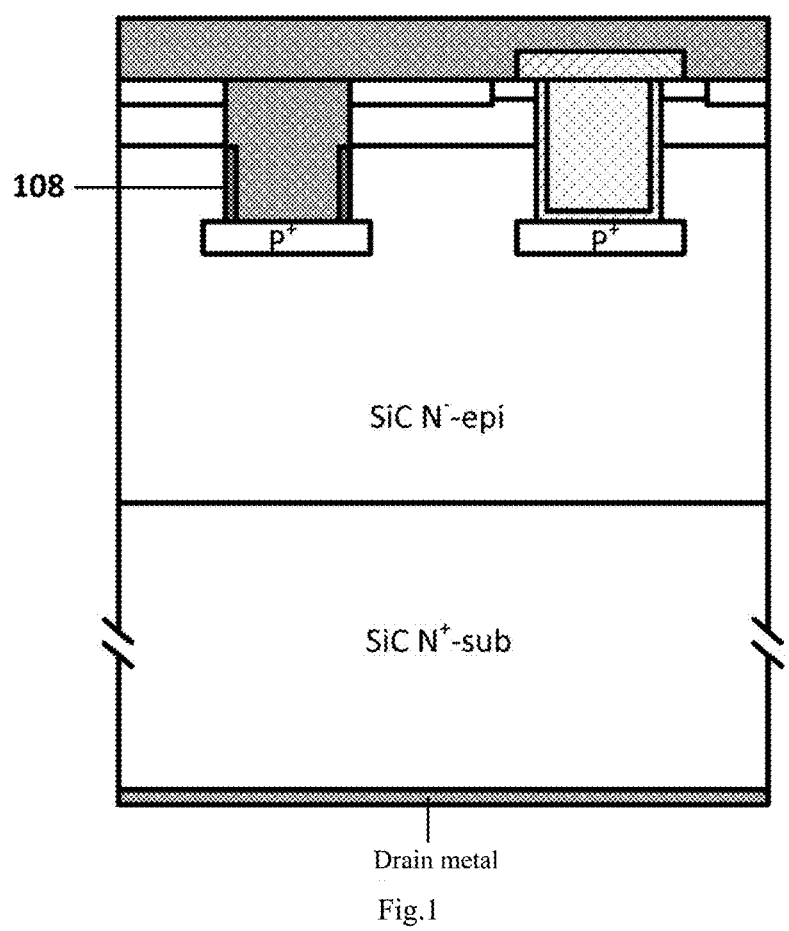
FIG. 1 is a schematic structural diagram of a cross-section of a cell of a trench gate silicon carbide MOSFET device in the prior art.
Figure 2:
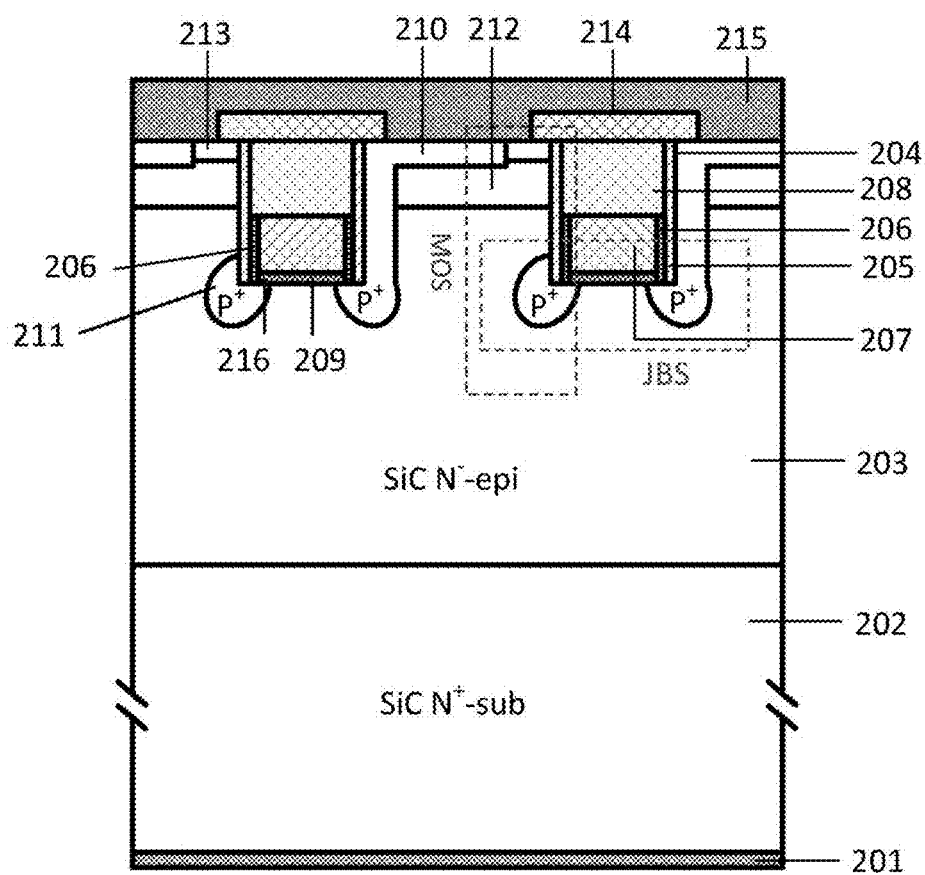
FIG. 2 is a schematic structural diagram of a cross-section of a cell of a trench gate silicon carbide MOSFET device along a line AB in FIG. 4 according to a first embodiment of the present disclosure.
Figure 3:
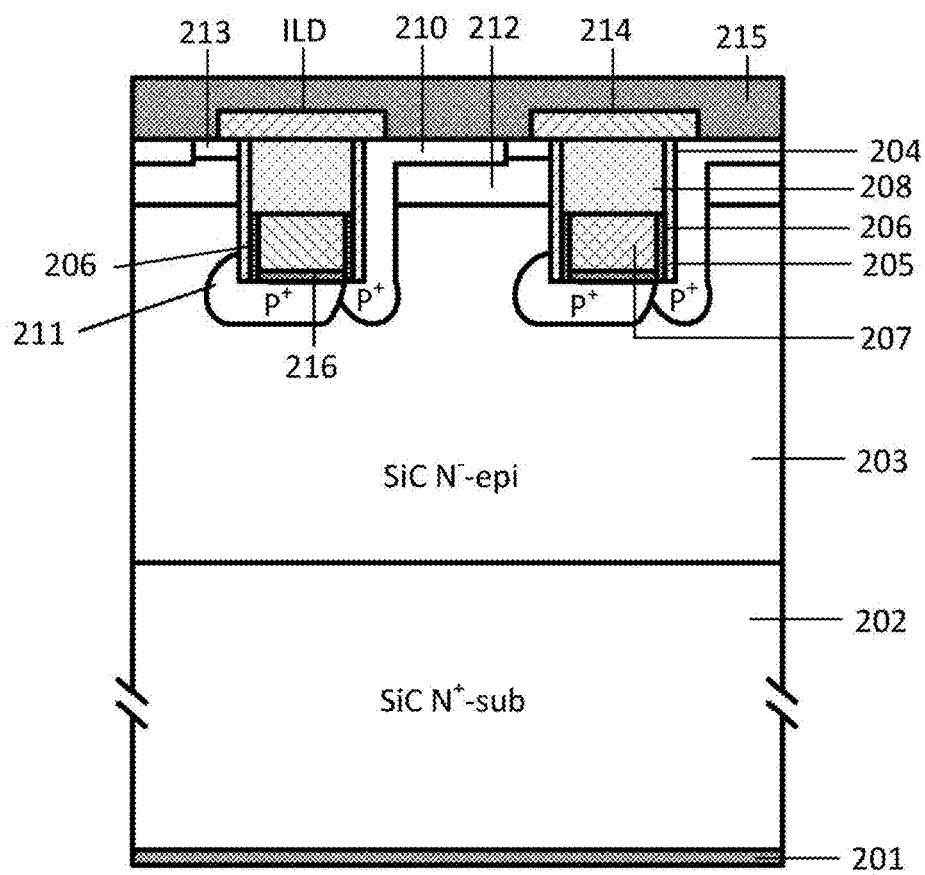
FIG. 3 is a schematic structural diagram of a cross-section of a cell of a trench gate silicon carbide MOSFET device along a line CD in FIG. 4 according to a first embodiment of the present disclosure.
Figure 4:
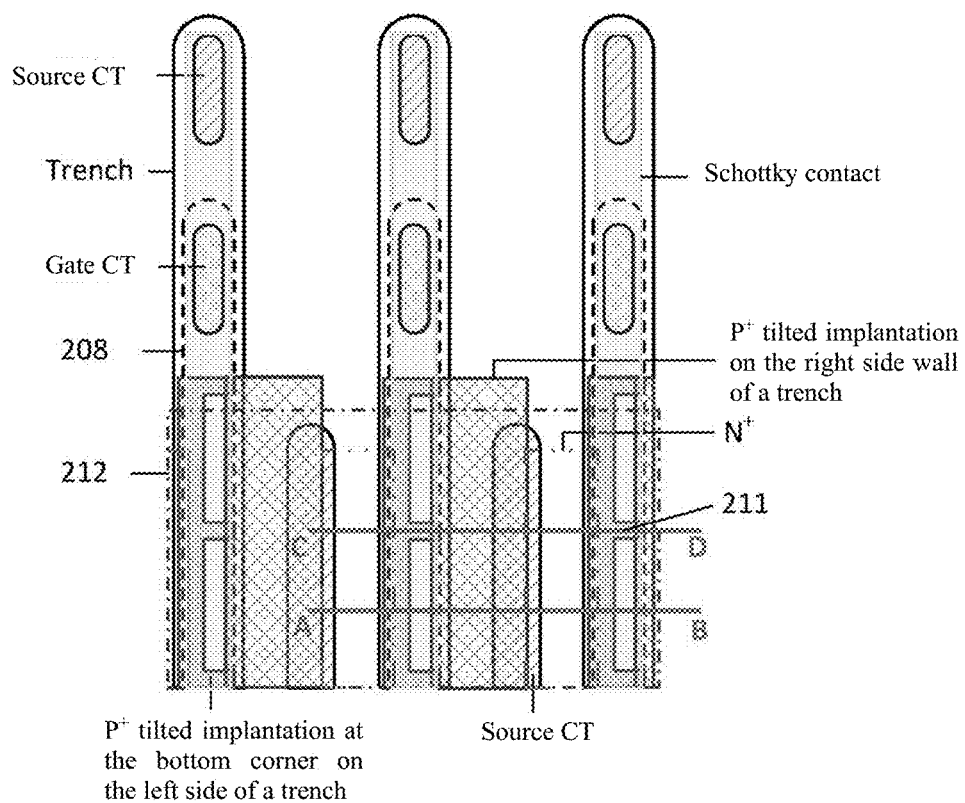
FIG. 4 is a schematic diagram of a stripe-shaped cell layout according to a first embodiment of the present disclosure.

FIG. 2 and FIG. 3 are schematic diagrams of a cross-section of a trench gate silicon carbide MOSFET device according to a first embodiment of the present disclosure, and FIG. 4 is a schematic diagram of a corresponding stripe-shaped cell layout. The device structurally includes a drain electrode 201 located at a bottom, where a heavily doped silicon carbide N+ substrate (including a buffer layer) 202 is located on the drain electrode 201. A silicon carbide N− epitaxial layer 203 is located on the heavily doped silicon carbide N+ substrate 202. Trench gates 204 arranged periodically are provided on a surface of the N− epitaxial layer 203, and each trench gate 204 includes a gate dielectric layer 205, a silicon nitride insulating layer 206, a low-temperature oxide layer 207, and a conductive dielectric polycrystalline silicon layer 208. A Schottky contact 209 connected to the N− epitaxial layer 203 and ohmic contacts 216 connected to a bottom corner P+ layer 211 and a side edge P+ layer 210 are formed at the bottom of the trench gate 204. The side edge P+ layer 210 is located on a right side of the trench gate 204 and extends from a bottom corner on the right side to an upper surface of the epitaxial layer 203. The bottom corner P+ layer 211 is located at a bottom corner on a left side of the trench gate 204 and is intersected with the side edge P+ layer 210 at an interval through a layout design to implement an equipotential. There is a P well 212 between the trench gates 204. An N+ source region 213 is provided inside the P well 212 and in a position adjacent to an upper surface of the side edge P+ layer 210. An interlayer dielectric layer 214 is located above the trench gate 204 and covers part of the N+ source region 213, and a source electrode 215 short-circuits the side edge P+ layer 210 and the N+ source region 213. The interlayer dielectric layer 214 isolates the source electrode 215 from a gate electrode.

Figure 5:
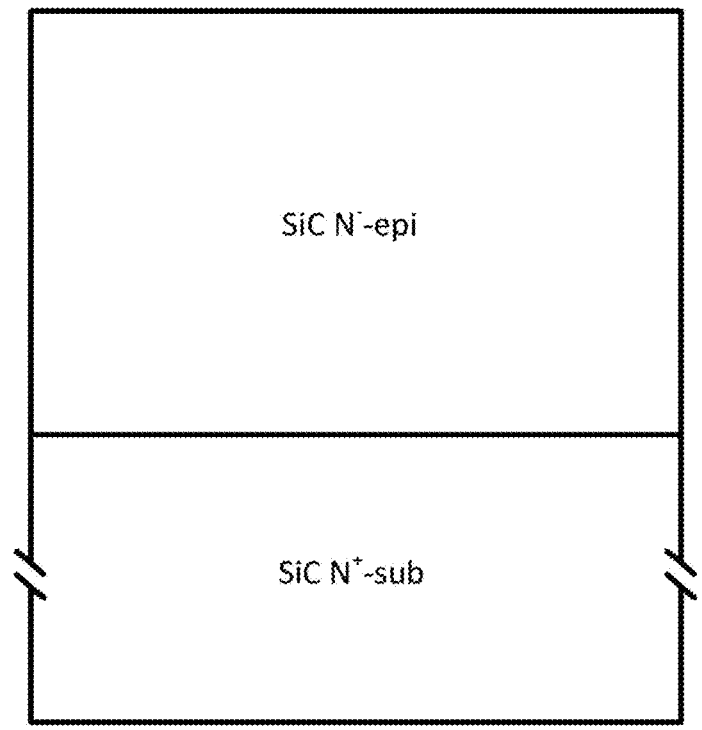
FIGS. 5 to 15 are schematic cross-sectional views of the main fabrication steps according to a first embodiment of the present disclosure.

In addition, the present disclosure provides a method for fabricating the device according to the first embodiment, as shown in FIGS. 5 to 15, including:

Firstly, growing an N− epitaxial layer 203 on a silicon carbide substrate (including a buffer layer), where a common doping impurity is nitrogen, as shown in FIG. 5.

Figure 6:
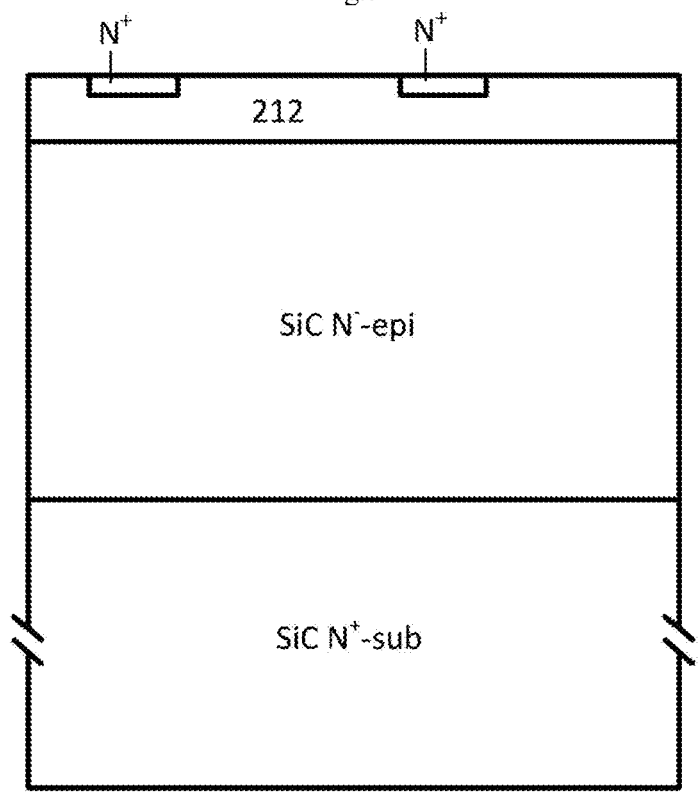

Secondly, forming a P well region and an N+ source region on an upper surface of the epitaxial layer using ion implantation, where common ions implanted into the P well region and the N+ source region are aluminum and phosphorus, respectively, as shown in FIG. 6.

Figure 7:
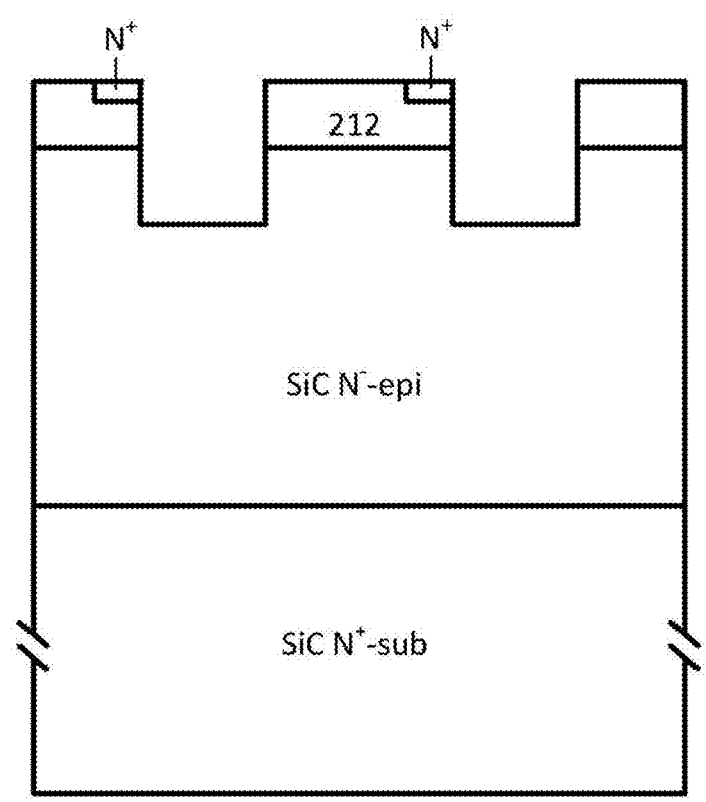

Thirdly, etching a trench in the upper surface of the epitaxial layer utilizing dry etching, where a typical trench depth is 0.5-3 microns, as shown in FIG. 7.

Figure 8:
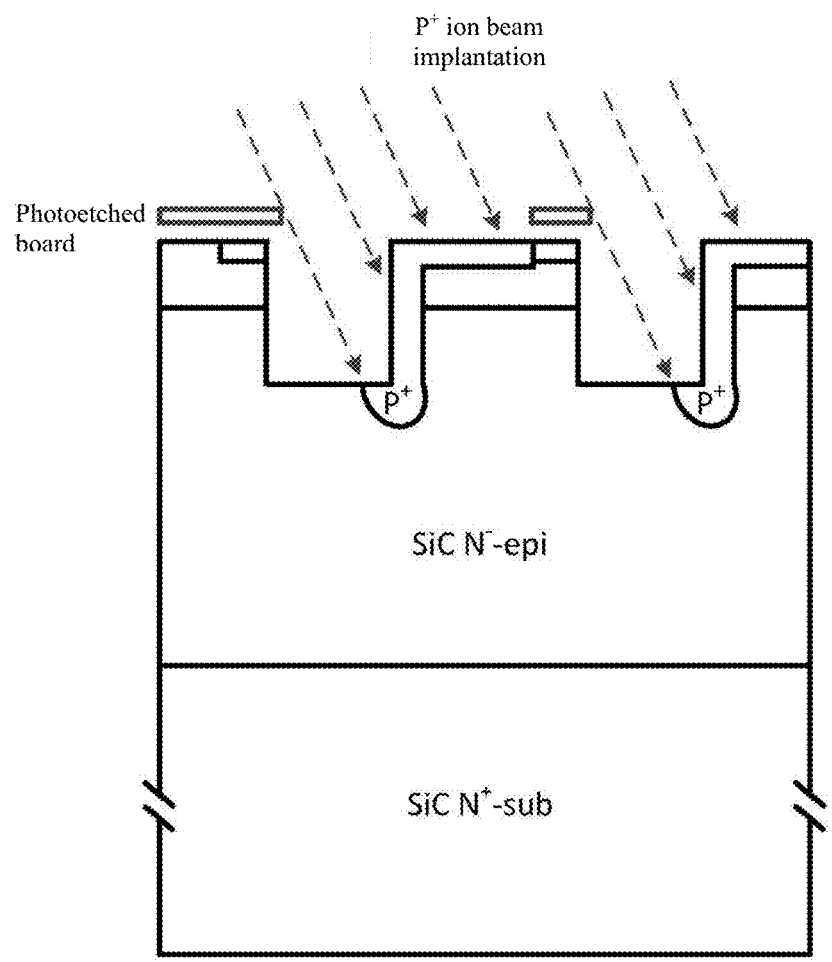

Fourthly, forming a side edge P+ region on a right side of the trench through selective ion implantation, where the ion implantation is performed in a rightwards tilted manner, and a common implantation temperature is 500° C., as shown in FIG. 8.

Figure 9:
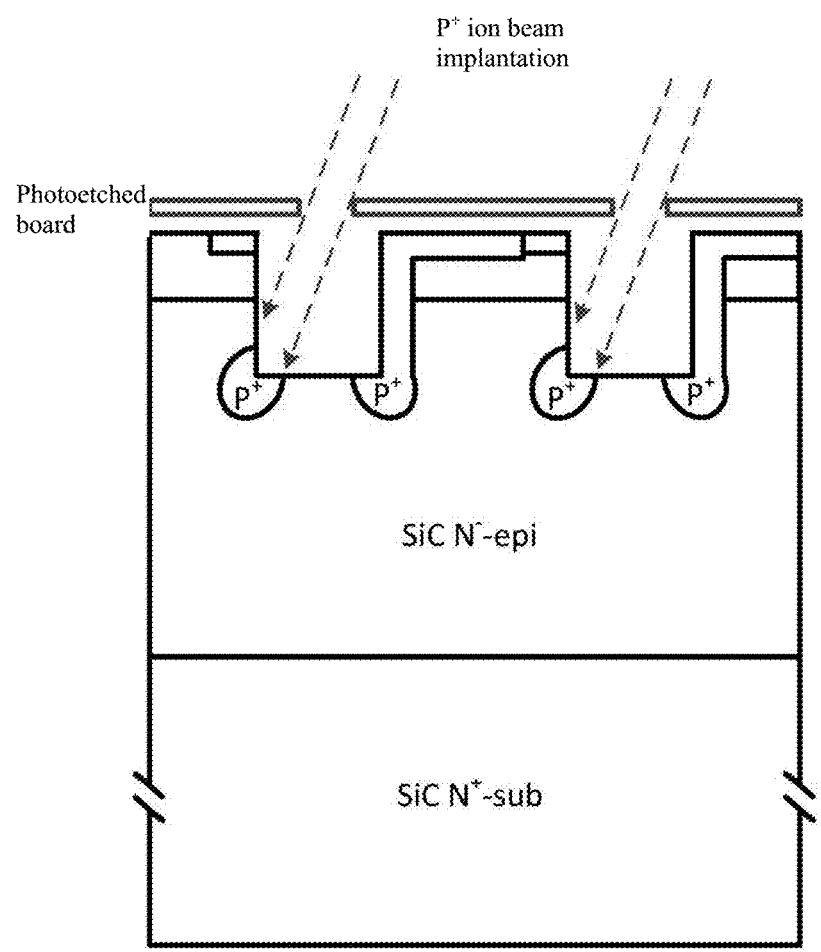

Fifthly, forming a P+ region at a bottom corner on a left side of the trench employing selective ion implantation, and after the ion implantation is completed, activating ions using high-temperature annealing, where the ion implantation is performed in a leftwards tilted manner, a common annealing temperature is 1,600-1,800° C., and before the annealing process, a carbon film is needed to cover a surface of silicon carbide, so as to prevent the outward diffusion of impurities and the migration of silicon carbide atoms on the surface, as shown in FIG. 9.

Figure 10:
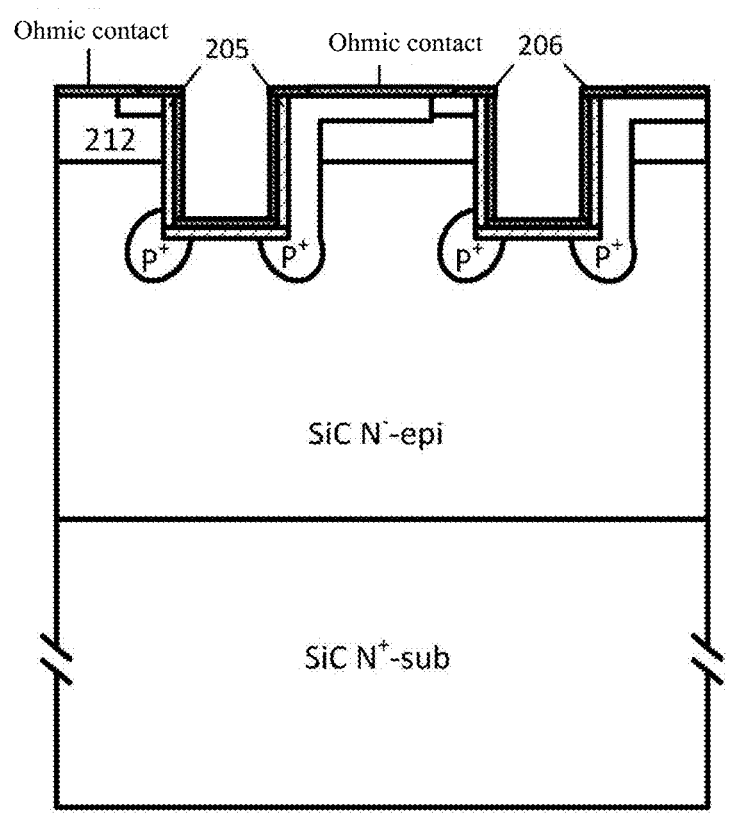

Sixthly, growing a gate dielectric layer 205, depositing a silicon nitride insulating layer 206, performing photolithography and etching to form a source metal window, depositing a source ohmic contact metal, performing photolithography and etching on the metal, and performing annealing to form a source ohmic contact, as shown in FIG. 10.

Figure 11:
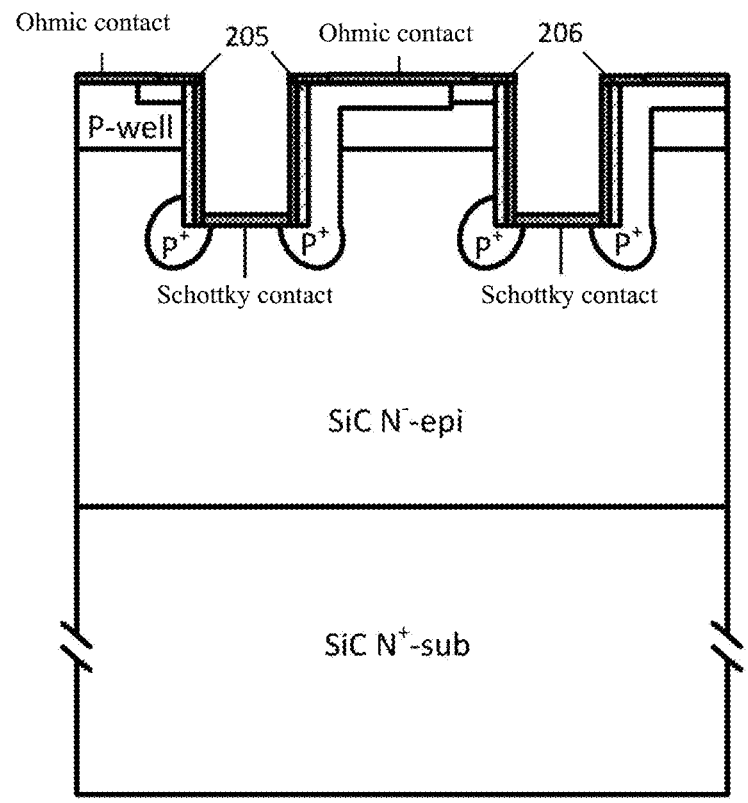

Seventhly, removing a silicon nitride layer and a silicon dioxide layer at the bottom of a trench gate through photolithography and etching, depositing a layer of Schottky metal, performing photolithography and etching, and reserving the Schottky metal at the bottom of the trench gate, where a common Schottky metal is titanium, as shown in FIG. 11.

Figure 12:
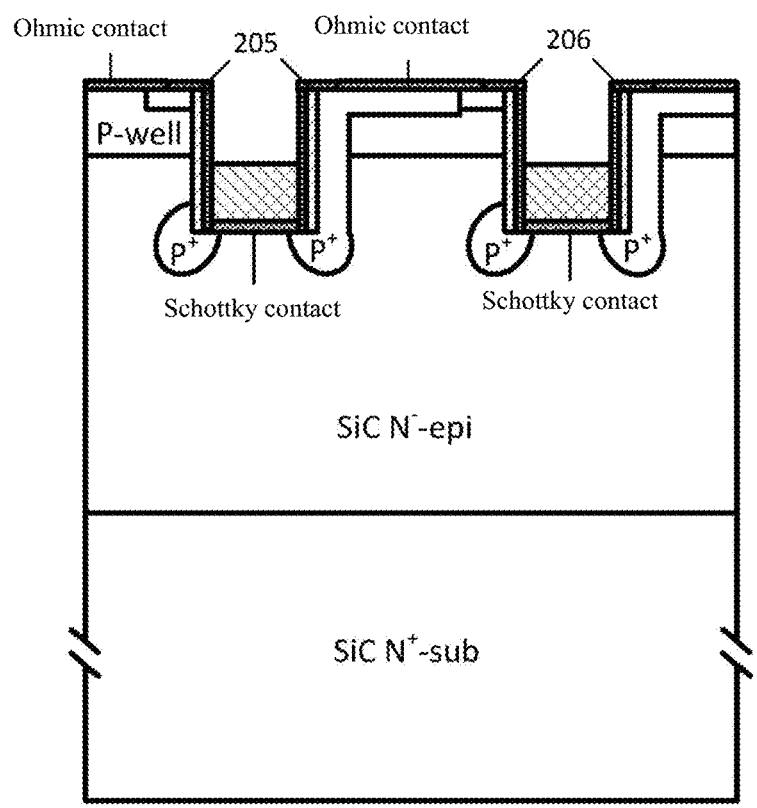

Eighthly, depositing a low-temperature oxide (LTO) layer at a low temperature and performing back etching, as shown in FIG. 12.

Figure 13:
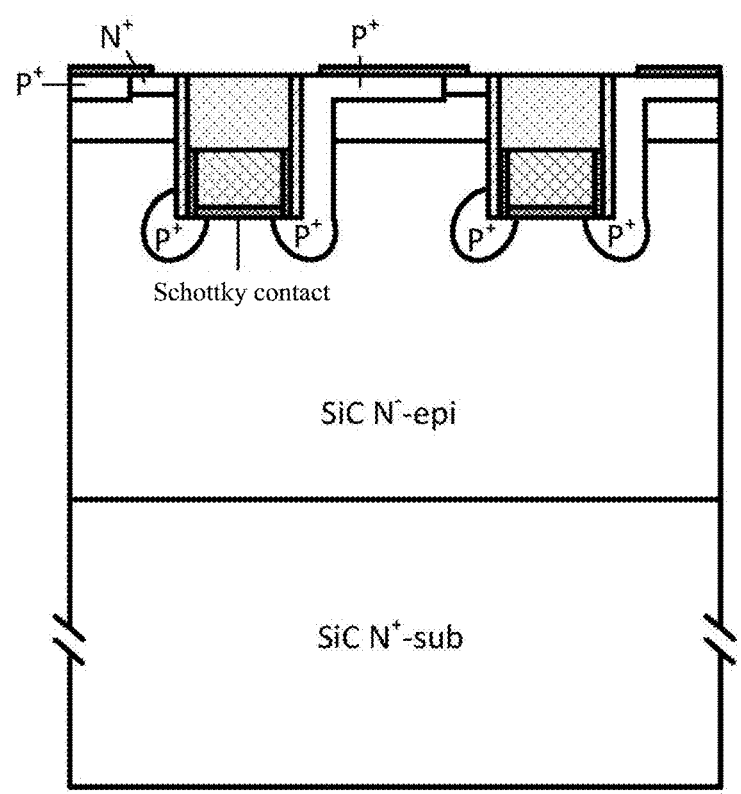

Ninthly, performing wet etching on a silicon nitride layer, then depositing a conductive dielectric polycrystalline silicon layer, and performing photolithography and etching, as shown in FIG. 13.

Figure 14:
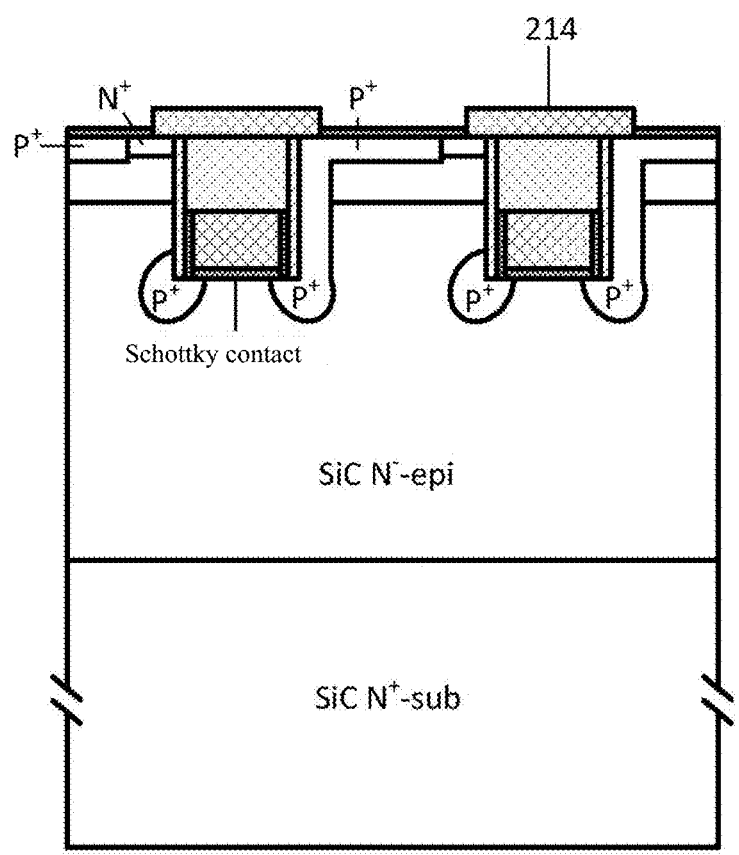

Tenthly, depositing an interlayer dielectric (ILD) layer at a low temperature and performing photolithography and etching, as shown in FIG. 14.

Figure 15:
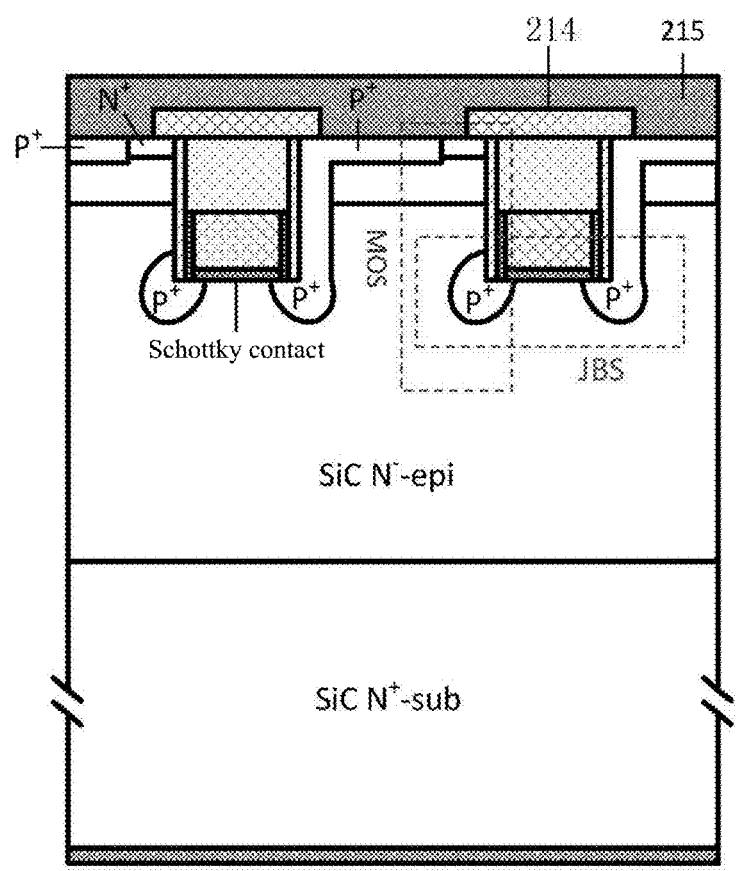

Finally, depositing a thick metal (such as aluminum), performing photolithography and etching, and performing back metal deposition and annealing, as shown in FIG. 15.

Embodiment 2

Figure 16:
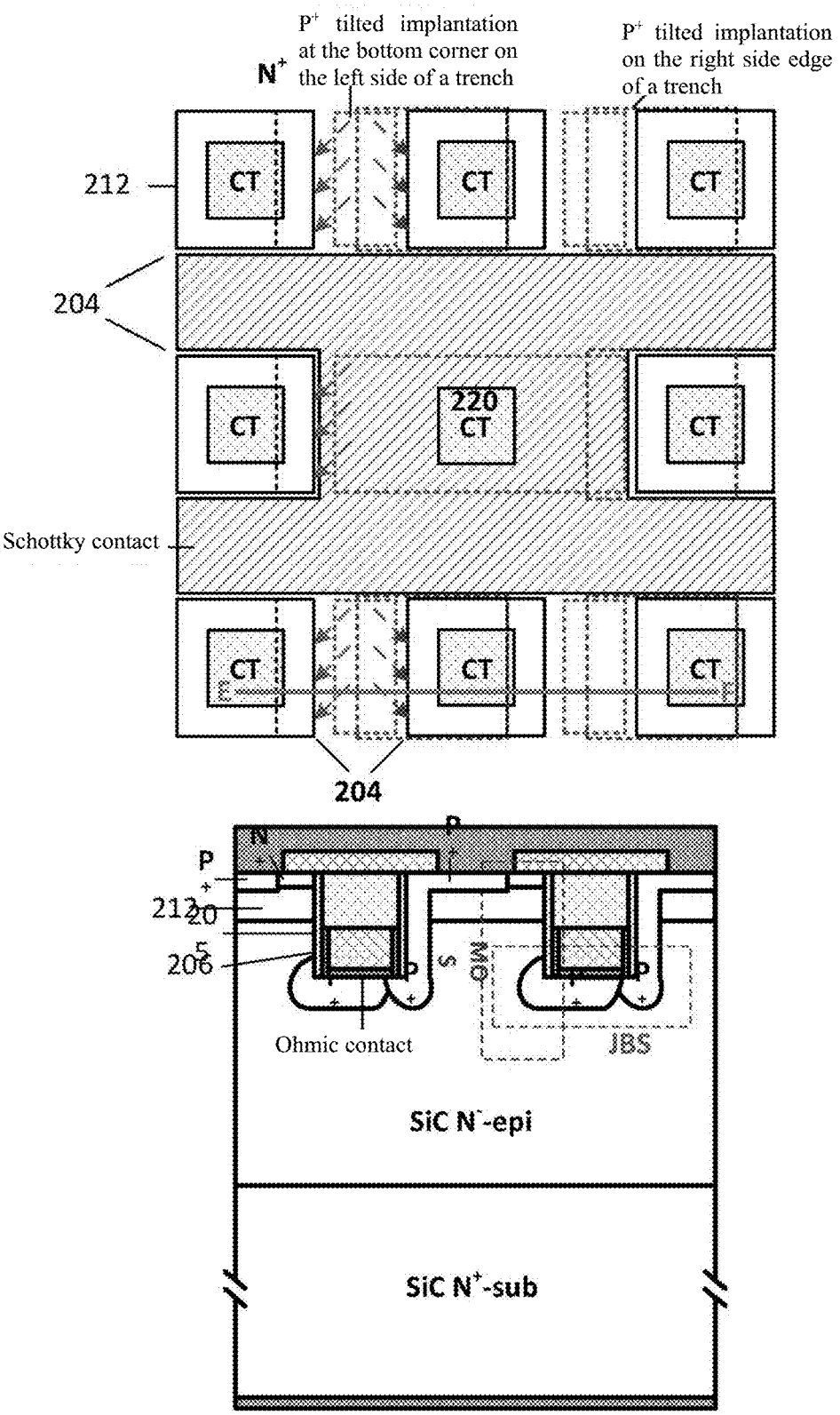
FIG. 16 is a schematic diagram of a square cell layout and a cross-section of a square cell along a line EF according to a second embodiment of the present disclosure.
Figure 17:
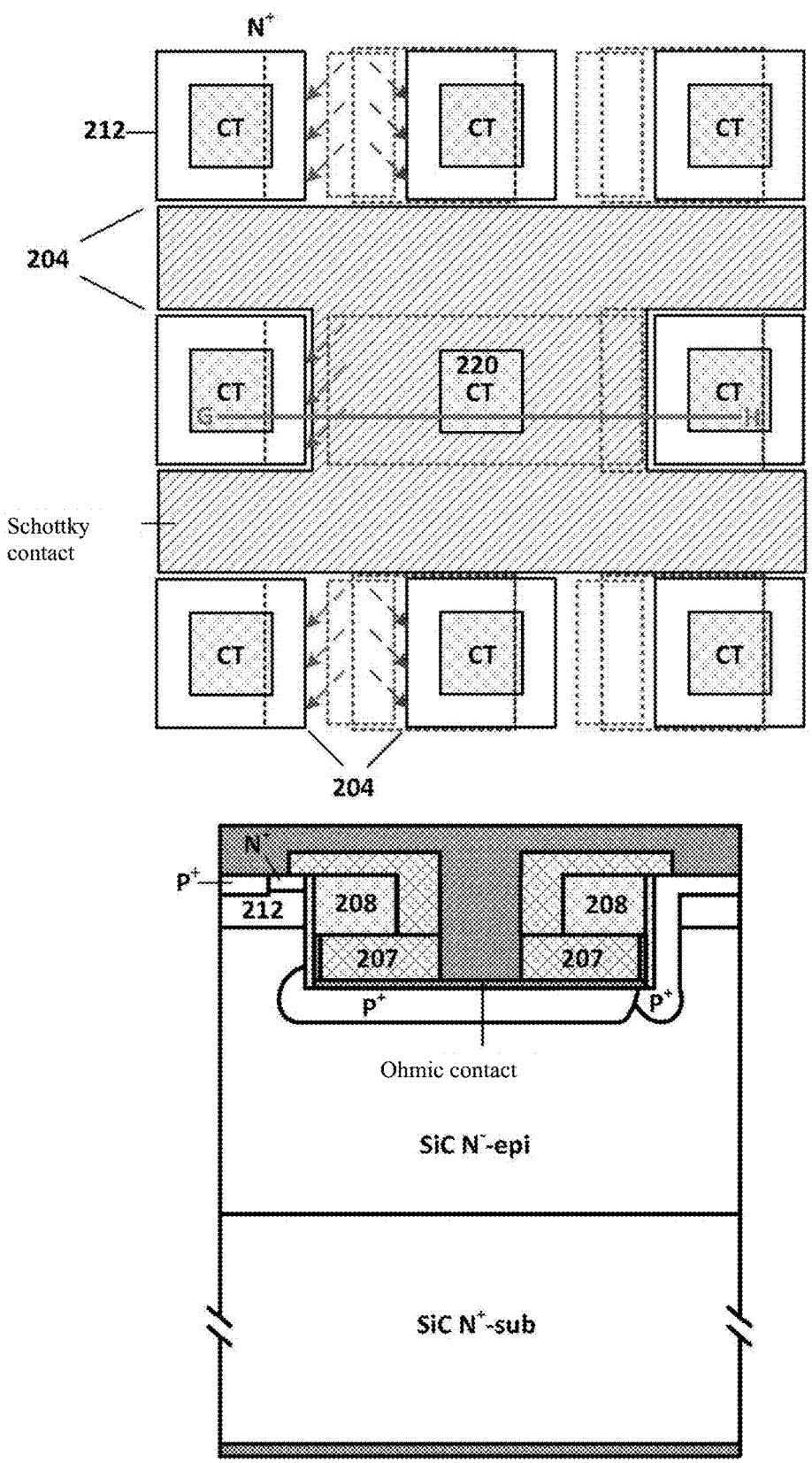
FIG. 17 is a schematic diagram of a square cell layout and a cross-section of a square cell along a line GH according to a second embodiment of the present disclosure.
Figure 18:
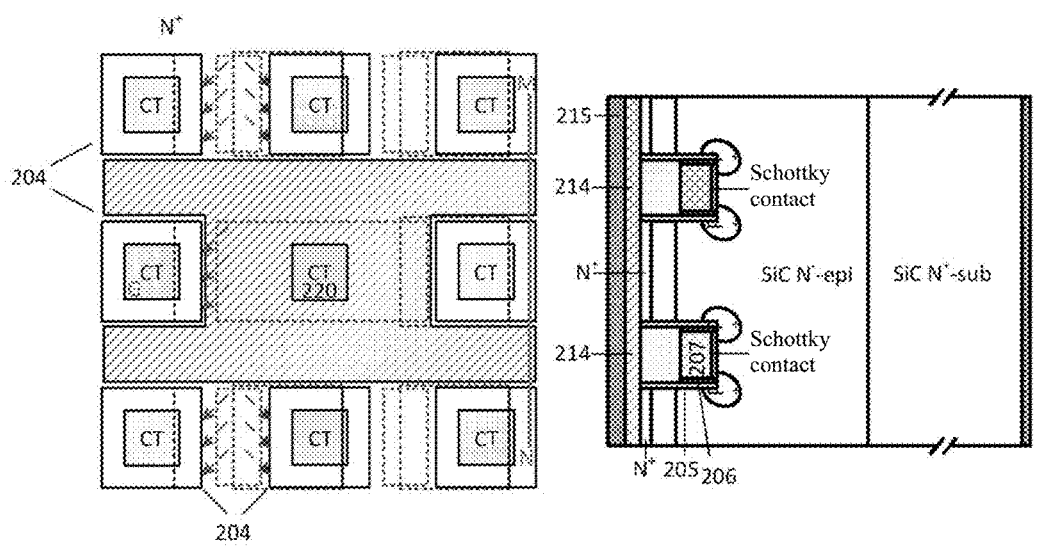
FIG. 18 is a schematic diagram of a square cell layout and a cross-section of a square cell along a line MN according to a second embodiment of the present disclosure.

FIGS. 16 to 18 are schematic structural diagrams of cross-sections of a trench gate silicon carbide MOSFET device along different positions of a layout according to a second embodiment of the present disclosure. Compared with the first embodiment of the present disclosure, the second embodiment has the following characteristics: a square cell is used. The P well 212 is a small island isolated by the trench gates 204. Trenches are crosswise arranged in a transverse direction and a longitudinal direction. One of four side surfaces of the trench gate 204 adjacent to the P well 212 is wrapped by P+, and four bottom corners are all protected by bottom corner P+. Therefore, an electric field in the gate dielectric layer can be significantly reduced. A JBS diode is integrated at the bottom of the trench gate 204 in the transverse direction. At the bottom of the trench gate 204 in another position, a metal is in contact with P+ to form an ohmic contact, and a positive electrode of the JBS diode is connected to the source electrode through a dummy cell 220.

The invention claimed is:

1. A trench gate silicon carbide metal oxide semiconductor field effect transistor (MOSFET) device, comprising a drain electrode located at a bottom of the device and a source electrode located at a top of the device, wherein a first conductive heavily doped silicon carbide substrate is disposed on the drain electrode; a first conductive lightly doped silicon carbide epitaxial layer is disposed on the first conductive heavily doped silicon carbide substrate; trench gates arranged periodically are provided on a surface of the first conductive lightly doped silicon carbide epitaxial layer; each of the trench gates comprises a gate dielectric layer disposed on a side wall of a trench, a conductive dielectric layer disposed above the trench, and a low-temperature oxide layer located below the trench; an insulating layer is disposed between the low-temperature oxide layer and the gate dielectric layer; a second conductive well region is disposed between the trench gates; an interlayer dielectric layer is disposed above the trench gate; one side edge of the trench gate is provided with a second conductive heavily doped side edge layer extending from a bottom corner of one side edge of the trench gate to an upper surface of the first conductive lightly doped silicon carbide epitaxial layer; a bottom corner of another side edge that is opposite to the bottom corner of one side edge of the trench gate is provided with a second conductive heavily doped bottom corner layer which is connected to the second conductive heavily doped side edge layer along a bottom of the trench gate through a layout design to obtain a same potential as the source electrode; a Schottky contact is formed between the bottom of the trench gate and the first conductive lightly doped silicon carbide epitaxial layer; ohmic contacts are formed between the bottom of the trench gate and the second conductive heavily doped bottom corner layer and between the bottom of the trench gate and the second conductive heavily doped side edge layer; a first conductive heavily doped source region is provided inside the second conductive well region and in a position adjacent to an upper surface of the second conductive heavily doped side edge layer; the interlayer dielectric layer covers part of the first conductive heavily doped source region; and the source electrode short-circuits the second conductive heavily doped side edge layer and the first conductive heavily doped source region.

2. The trench gate silicon carbide MOSFET device according to claim 1, wherein each of the trench gates is a stripe-shaped cell trench; one side surface of the stripe-shaped cell trench is provided with a second conductive heavily doped side edge layer extending from a bottom corner of the side edge to the upper surface of the first conductive lightly doped silicon carbide epitaxial layer; and a bottom corner of the opposite other side surface of the stripe-shaped cell trench is provided with a second conductive heavily doped bottom corner layer.

3. The trench gate silicon carbide MOSFET device according to claim 1, wherein the second conductive heavily doped side edge layer is in an inverted "L" shape.

4. The trench gate silicon carbide MOSFET device according to claim 1, wherein the device adopts a square cell layout design; the trench gates are crosswise arranged in a transverse direction and a longitudinal direction; the second conductive well region is divided into evenly arranged island shapes by the crosswise arranged trench gates; one of four surfaces of a corresponding one of the trench gates adjacent to the second conductive well region is provided with a second conductive heavily doped side edge layer; and a bottom corner of opposite another surface of the trench gate adjacent to the second conductive well region is provided with two second conductive heavily doped bottom corner layers extending along a bottom edge and connected to each other.

5. The trench gate silicon carbide MOSFET device according to claim 1, wherein a Schottky metal is titanium, nickel, and/or molybdenum.

6. The trench gate silicon carbide MOSFET device according to claim 1, wherein each of the trench gates has a depth of 0.5-5 microns.

7. The trench gate silicon carbide MOSFET device according to claim 1, wherein the conductive dielectric layer is a polycrystalline silicon layer or other metal silicide materials.

8. The trench gate silicon carbide MOSFET device according to claim 1, wherein the low-temperature oxide layer is an insulating material with a deposition temperature of no higher than 600° C.

9. The trench gate silicon carbide MOSFET device according to claim 1, wherein the gate dielectric layer is made from silicon dioxide, silicon nitride, and/or hafnium dioxide, with a thickness of 0.02-0.5 microns.

10. A method for fabricating the trench gate silicon carbide MOSFET device according to claim 1, comprising the following steps:
- first, growing a first conductive lightly doped silicon carbide epitaxial layer on a substrate;
- secondly, forming a second conductive well region and a first conductive heavily doped source region on an upper surface of the first conductive lightly doped silicon carbide epitaxial layer using ion implantation;
- thirdly, etching a trench in the upper surface of the first conductive lightly doped silicon carbide epitaxial layer using dry etching;
- fourthly, forming a second conductive heavily doped side edge layer on one side surface of the trench by means of selective ion implantation;
- fifthly, forming a second conductive heavily doped bottom corner layer at a bottom corner of another side surface of the trench using selective ion implantation, and after the ion implantation is completed, activating ions using high-temperature annealing, wherein before the annealing process, a carbon film is needed to cover a surface of silicon carbide, so as to prevent the outward diffusion of impurities and the migration of silicon carbide atoms on the surface;
- sixthly, growing a gate dielectric layer, depositing an insulating layer, performing photolithography and etching to form a source metal window, depositing a source ohmic contact metal, performing photolithography and etching on the metal, and performing annealing to form an ohmic contact below a source electrode;
- seventhly, removing an insulating layer at a bottom of a trench gate using photolithography and etching, depositing a layer of Schottky metal, performing photolithography and etching, and reserving the Schottky metal at the bottom of the trench gate;
- eighthly, depositing a low-temperature oxide layer at a low temperature and performing back etching;
- ninthly, performing wet etching on an insulating layer above the low-temperature oxide layer, then depositing a conductive dielectric layer, and performing photolithography and etching;
- tenthly, depositing an interlayer dielectric layer at a low temperature and performing photolithography and etching; and
- eleventhly, depositing a thick metal at a top of a device, performing photolithography and etching, and performing back metal deposition and annealing.

* * * * *